US012796446B2

(12) United States Patent
Takekida

(10) Patent No.: US 12,796,446 B2
(45) Date of Patent: Nov. 10, 2026

(54) SEMICONDUCTOR DEVICE AND METHOD OF MANUFACTURING THE SAME

(71) Applicant: Kioxia Corporation, Tokyo (JP)

(72) Inventor: Hideto Takekida, Nagoya Aichi (JP)

(73) Assignee: Kioxia Corporation, Tokyo (JP)

( * ) Notice: Subject to any disclaimer, the term of this patent is extended or adjusted under 35 U.S.C. 154(b) by 431 days.

(21) Appl. No.: 18/586,819

(22) Filed: Feb. 26, 2024

(65) Prior Publication Data

US 2024/0290717 A1 Aug. 29, 2024

(30) Foreign Application Priority Data

Feb. 28, 2023 (JP) ................................ 2023-029931

(51) Int. Cl.

| | |
|---|---|
| ***H10W 20/41*** | (2026.01) |
| ***G11C 5/06*** | (2006.01) |
| ***H10B 41/27*** | (2023.01) |
| ***H10B 43/27*** | (2023.01) |
| ***H10W 20/42*** | (2026.01) |

(52) U.S. Cl.

CPC ........... *H10W 20/435* (2026.01); *G11C 5/063* (2013.01); *H10B 41/27* (2023.02); *H10B 43/27* (2023.02); *H10W 20/42* (2026.01)

(58) Field of Classification Search

CPC .... H10W 20/435; H10W 20/42; G11C 5/063; H10B 41/27; H10B 43/27; H10B 43/40

See application file for complete search history.

(56) References Cited

U.S. PATENT DOCUMENTS

| | | | | |
|---|---|---|---|---|
| 2016/0141301 A1 | 5/2016 | Mokhlesi et al. | | |
| 2022/0180939 A1* | 6/2022 | Fukuzumi | G11C 16/26 | |
| 2022/0189984 A1* | 6/2022 | Okina | H10B 41/10 | |
| 2022/0229588 A1* | 7/2022 | Dutta | G06F 3/0659 | |
| 2022/0344361 A1* | 10/2022 | Jeon | H10B 41/10 | |
| 2023/0200067 A1* | 6/2023 | Kim | H10B 41/27 | 257/314 |

* cited by examiner

*Primary Examiner* — Victor A Mandala

(74) *Attorney, Agent, or Firm* — Maier & Maier, PLLC

(57) ABSTRACT

In one embodiment, a semiconductor device includes a memory cell array, a first interconnect layer provided below the memory cell array, and including a plurality of first bit lines that extend in a first direction, and a second interconnect layer provided below the memory cell array, and including a plurality of first source lines that extend in a second direction different from the first direction, the second interconnect layer being different from the first interconnect layer. The device further includes a third interconnect layer provided above the memory cell array, and including a plurality of second source lines that extend in the second direction, and a fourth interconnect layer provided above the memory cell array, and including a plurality of second bit lines that extend in the first direction, the fourth interconnect layer being different from the third interconnect layer.

20 Claims, 12 Drawing Sheets

SEMICONDUCTOR DEVICE AND METHOD OF MANUFACTURING THE SAME

CROSS-REFERENCE TO RELATED APPLICATION

This application is based upon and claims the benefit of priority from the prior Japanese Patent Application No. 2023-029931, filed on Feb. 28, 2023, the entire contents of which are incorporated herein by reference.

FIELD

Embodiments described herein relate to a semiconductor device and a method of manufacturing the same.

BACKGROUND

When the pitch between interconnects of a three-dimensional memory is reduced, the performance of memory cells of the three-dimensional memory could deteriorate. For example, when the pitch between bit lines is reduced, the parasitic capacitance of each bit line increases, which could deteriorate write performance and read performance of the memory cells.

DETAILED DESCRIPTION

Embodiments will now be explained with reference to the accompanying drawings. In FIGS. 1 to 12C, the same components are assigned the same reference signs, and the overlapping description will be omitted.

In one embodiment, a semiconductor device includes a memory cell array, a first interconnect layer provided below the memory cell array, and including a plurality of first bit lines that extend in a first direction, and a second interconnect layer provided below the memory cell array, and including a plurality of first source lines that extend in a second direction different from the first direction, the second interconnect layer being different from the first interconnect layer. The device further includes a third interconnect layer provided above the memory cell array, and including a plurality of second source lines that extend in the second direction, and a fourth interconnect layer provided above the memory cell array, and including a plurality of second bit lines that extend in the first direction, the fourth interconnect layer being different from the third interconnect layer.

First Embodiment

Figure 1:
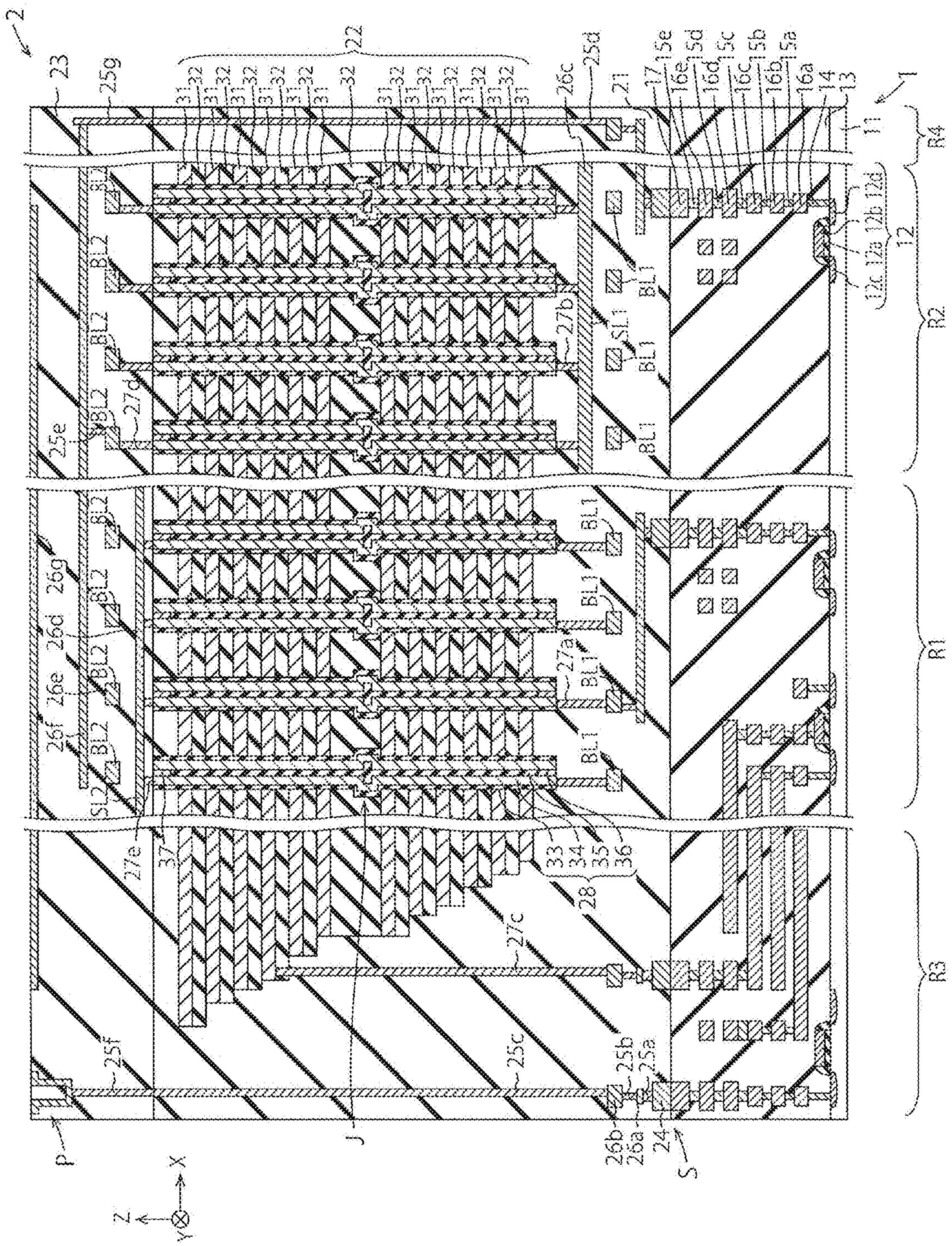
FIG. 1 is a cross-sectional view showing the structure of a semiconductor device of a first embodiment.

FIG. 1 is a cross-sectional view showing the structure of a semiconductor device of a first embodiment.

The semiconductor device of the present embodiment is, for example, a semiconductor chip including a three-dimensional memory. As will be described later, the semiconductor device of the present embodiment is manufactured by bonding a circuit wafer including a circuit chip 1 and an array wafer including an array chip 2 together. FIG. 1 shows a bonding face S between the circuit chip 1 and the array chip 2. The array chip 2 includes a memory cell array including a plurality of memory cells and the circuit chip 1 includes a CMOS circuit that controls the operation of the memory cell array.

The circuit chip 1 includes a substrate 11, a plurality of transistors 12, an inter layer dielectric 13, a plurality of contact plugs 14, a plurality of via plugs 15*a* to 15*e*, a plurality of interconnect layers 16*a* to 16*e*, and a plurality of metal pads 17. Further, the transistors 12 each include a gate insulator 12*a*, a gate electrode 12*b*, a diffusion layer 12*c*, and a diffusion layer 12*d*.

The array chip 2 includes an inter layer dielectric 21, a stacked film 22, an inter layer dielectric 23, a plurality of metal pads 24, a plurality of via plugs 25*a* to 25*g*, a plurality of interconnect layers 26*a* to 26*g*, a plurality of contact plugs 27*a* to 27*e*, and a plurality of columnar portions 28. Further, the stacked film 22 includes a plurality of electrode layers 31 and a plurality of insulators 32. Further, the columnar portions 28 each include a memory insulator 33, a channel semiconductor layer 34, a core insulator 35, a core semiconductor layer 36, and a core semiconductor layer 37. The interconnect layers 26*b*, 26*c*, 26*d*, and 26*e* are examples of a first, a second, a third, and a fourth interconnect layers, respectively. The channel semiconductor layer 34, the core semiconductor layer 36, and the core semiconductor layer 37 are examples of a semiconductor layer.

The substrate 11 is, for example, a semiconductor substrate such as a Si (silicon) substrate. FIG. 1 shows an X direction and a Y direction that are parallel to a surface of the substrate 11 and are perpendicular to each other and a Z direction that is perpendicular to the surface of the substrate 11. The X direction, the Y direction, and the Z direction cross one another. In the present specification, a +Z direction is assumed to be an upward direction and a −Z direction is assumed to be a downward direction. The −Z direction may or may not correspond to the gravity direction. The Y direction is an example of a first direction, the X direction is an example of a second direction, and the Z direction is an example of a third direction. FIG. 1 further shows an inside of the substrate 11 and regions R1 to R4 on the substrate 11. The details of the regions R1 to R4 will be described later.

The transistors 12 each include the gate insulator 12*a* and the gate electrode 12*b* that are sequentially formed on the substrate 11 and the diffusion layers 12*c*, 12*d* that are formed inside the substrate 11. One of the diffusion layers 12*c*, 12*d* functions as a source region, and the other of the diffusion layers 12*c*, 12*d* functions as a drain region. The circuit chip 1 includes the plurality of transistors 12 on the substrate 11 and these transistors 12 form the aforementioned CMOS circuit. The CMOS circuit includes, for example, a sense amplifier (S/A) and a word line switch (WLSW).

The inter layer dielectric 13 is formed on the substrate 11 so as to cover the transistors 12. The inter layer dielectric 13 is, for example, a stacked film including a $SiO_2$ film (silicon oxide film) and other insulators.

The contact plugs 14 are each formed on the gate electrode 12*b*, the diffusion layer 12*c*, or the diffusion layer 12*d* of the corresponding transistor 12. The via plugs 15*a* to 15*e* and the interconnect layers 16*a* to 16*e* are formed on the contact plug 14 in the order of the interconnect layer 16*a*, the via plug 15*a*, the interconnect layer 16*b*, the via plug 15*b*, the interconnect layer 16*c*, the via plug 15*c*, the interconnect layer 16*d*, the via plug 15*d*, the interconnect layer 16*e*, and the via plug 15*e*. In the interconnect layers 16*a* to 16*e*, each one of the interconnect layers includes a plurality of interconnects.

The metal pads 17 are each disposed on the corresponding via plug 15*e* in the inter layer dielectric 13. The metal pads 17 are, for example, a metal layer including a Cu (copper) layer.

The inter layer dielectric 21 is formed on the inter layer dielectric 13. The inter layer dielectric 21 is, for example, a stacked film including a $SiO_2$ film (silicon oxide film) and other insulators.

The stacked film 22 is provided in the inter layer dielectric 21 and includes the plurality of electrode layers 31 and the plurality of insulators 32 that are alternately stacked in the Z direction. These electrode layers 31 are spaced apart from one another in the Z direction. These electrode layers 31 include, for example, a plurality of word lines and a plurality of select lines. Each electrode layer 31 is, for example, a metal layer including a W (tungsten) layer. Each insulator 32 is, for example, a $SiO_2$ film. The stacked film 22 forms the aforementioned memory cell array, together with the columnar portions 28 and the like. The stacked film 22 is disposed in the regions R1 to R3 and includes a step structure portion in the region R3. The stacked film 22 of the present embodiment includes the plurality of insulators 32 forming lower layers, the plurality of insulators 32 forming upper layers, and a thick insulator 32 provided between the lower layers and the upper layers.

The inter layer dielectric 23 is formed on the inter layer dielectric 21. The inter layer dielectric 23 is, for example, a stacked film including a $SiO_2$ film and other insulators.

The metal pads 24 are each disposed on the corresponding metal pad 17 in the inter layer dielectric 21. The metal pads 24 are, for example, a metal layer including a Cu layer.

The via plugs 25*a* and 25*b* and the interconnect layers 26*a* and 26*b* are formed on the metal pad 24 in the inter layer dielectric 21 in the order of the via plug 25*a*, the interconnect layer 26*a*, the via plug 25*b*, and the interconnect layer 26*b*. The interconnect layer 26*a* is disposed below the stacked film 22 and the interconnect layer 26*b* is disposed at a higher position than the interconnect layer 26*a* below the stacked film 22. In the interconnect layers 26*a* to 26*b*, each one of the interconnect layers includes a plurality of interconnects.

The interconnect layer 26*b* includes, in the regions R1 to R2, a plurality of bit lines BL1 extending in the Y direction and adjacent to one another in the X direction. These bit lines BL1 are examples of a first bit line. FIG. 1 shows eight of these bit lines BL1. The bit lines BL1 are electrically connected to the transistors 12 in the S/A. In FIG. 1, one bit line BL1 is electrically connected to the transistor 12 in the region R1 via a pair of metal pads 17, 24. This transistor 12 is an example of a first transistor, and these metal pads 17, 24 are examples of first and second pads.

The via plug 25*c* is formed on the interconnect layer 26*b* in the inter layer dielectric 21 and is disposed in the region R3. The via plug 25*d* is formed on the interconnect layer 26*b* in the inter layer dielectric 21 and is disposed in the region R4.

The interconnect layer 26*c* is formed in the inter layer dielectric 21 and is disposed at a higher position than the interconnect layer 26*b* below the stacked film 22. The interconnect layer 26*c* includes a plurality of interconnects, as with the interconnect layers 26*a* and 26*b*.

The interconnect layer 26*c* includes, in the region R2, a plurality of source lines SL1 extending in the X direction and adjacent to one another in the Y direction. These source lines SL1 are examples of a first source line. FIG. 1 shows one of these source lines SL1.

The contact plugs 27*a* are formed on the corresponding bit lines BL1 and are electrically connected to the corresponding columnar portions 28. FIG. 1 shows four contact plugs 27*a* respectively formed on the four bit lines BL1. These contact plugs 27*a* are electrically connected to the four columnar portions 28, respectively.

The contact plugs 27*b* are formed on the corresponding source lines SL1 and are electrically connected to the corresponding columnar portions 28. FIG. 1 shows four contact plugs 27*b* formed on the same one source line SL1. These contact plugs 27*b* are electrically connected to the four columnar portions 28, respectively.

The contact plugs 27*c* are formed on the interconnect layer 26*b* and are electrically connected to the corresponding electrode layers 31.

FIG. 1 shows one contact plug 27*c* formed on one interconnect in the interconnect layer 26*b*. This contact plug 27*c* is electrically connected to one electrode layer 31.

The interconnect layer 26*d* is formed in the inter layer dielectric 23 and is disposed above the stacked film 22. The interconnect layer 26*d* includes a plurality of interconnects, as with the interconnect layers 26*a* to 26*c*.

The interconnect layer 26*d* includes, in the region R1, a plurality of source lines SL2 extending in the X direction and adjacent to one another in the Y direction. These source lines SL2 are examples of a second source line. FIG. 1 shows one of these source lines SL2.

The via plug 25*e* and the interconnect layers 26*e* and 26*f* are formed on the contact plug 27*d* in the inter layer dielectric 23 in the order of the interconnect layer 26*e*, the via plug 25*e*, and the interconnect layer 26*f*. The interconnect layer 26*e* is disposed at a higher position than the interconnect layer 26*d* above the stacked film 22 and the interconnect layer 26*f* is disposed at a higher position than the interconnect layer 26*e* above the stacked film 22. In the interconnect layers 26*e* and 26*f*, each one of the layers includes a plurality of interconnects.

The interconnect layer 26*e* includes, in the regions R1 to R2, a plurality of bit lines BL2 extending in the Y direction and adjacent to one another in the X direction. These bit lines BL2 are examples of a second bit line. FIG. 1 shows eight of these bit lines BL2. The bit lines BL2 are electrically connected to the transistors 12 in the S/A. In FIG. 1, one bit line BL2 is electrically connected to the transistor 12 in the region R2 via the pair of metal pads 17, 24. The transistors 12 are an example of a second transistor and these metal pads 17, 24 are examples of third and fourth pads.

The contact plugs 27*d* are formed below the corresponding bit lines BL2 and are electrically connected to the corresponding columnar portions 28. FIG. 1 shows four contact plugs 27*d* respectively formed below the four bit lines BL2. These contact plugs 27*d* are electrically connected to the four columnar portions 28, respectively.

The contact plugs 27*e* are formed on the corresponding source lines SL2 and are electrically connected to the corresponding columnar portions 28. FIG. 1 shows four contact plugs 27*e* formed below the same one source line SL2. These contact plugs 27*e* are electrically connected to the four columnar portions 28, respectively.

The via plug 25*f* is formed in the inter layer dielectric 23 on the via plug 25*c* and is disposed in the region R3. The via plug 25*g* is formed in the inter layer dielectric 23 on the via plug 25*d* and is disposed in the region R4. The via plug 25*g* is further electrically connected to the interconnect layer 26*f*.

The interconnect layer 26*g* is formed in the inter layer dielectric 23 and is disposed at a higher position than the interconnect layer 26*f* above the stacked film 22. The interconnect layer 26*g* includes a plurality of interconnects, as with the interconnect layers 26*a* to 26*f*. The interconnect layer 26*g* includes, for example, interconnects functioning as a bonding pad P in the region R3. The bonding pad P is disposed on the via plug 25*f*.

The columnar portions 28 are formed in the stacked film 22 and have a columnar shape extending in the Z direction. The columnar portions 28 each include the memory insulator 33, the channel semiconductor layer 34, and the core insulator 35 that are sequentially provided in the stacked film 22, the core semiconductor layer 36 provided below the core insulator 35, and the core semiconductor layer 37 provided on the core insulator 35. The channel semiconductor layer 34 is, for example, a polysilicon layer. The core insulator 35 is, for example, a $SiO_2$ film. The core semiconductor layers 36, 37 are, for example, polysilicon layers. The core semiconductor layers 36, 37 are electrically connected to the channel semiconductor layer 34. The columnar portions 28 form the plurality of memory cells, together with the electrode layers 31 and the like. The columnar portions 28 of the present embodiment each include a joint portion J in the aforementioned thick insulator 32.

In the region R1 shown in FIG. 1, the channel semiconductor layer 34 and the core semiconductor layers 36, 37 of the columnar portions 28 are electrically connected to the corresponding bit lines BL1 and the corresponding source lines SL2. The columnar portions 28 are examples of a first columnar portion. Further, in the region R2 shown in FIG. 1, the channel semiconductor layers 34 and the core semiconductor layers 36, 37 of the columnar portions 28 are electrically connected to the corresponding bit lines BL2 and the corresponding source lines SL1. The columnar portions 28 are examples of a second columnar portion.

As described above, the semiconductor device of the present embodiment includes not only the bit lines BL1 disposed below the stacked film 22, but also the bit lines BL2 disposed above the stacked film 22. Therefore, as compared to a case in which the bit lines are disposed only below the stacked film 22 and a case in which the bit lines are disposed only above the stacked film 22, the present embodiment makes it possible to increase the pitch between the bit lines BL1 and the pitch between the bit lines BL2. This makes it possible to reduce the parasitic capacitance of the bit lines BL1, BL2, so that the wright performance and the read performance of the memory cells can be improved. Further, the semiconductor device of the present embodiment includes not only the source lines SL1 disposed above the stacked film 22, but also the source lines SL2 disposed below the stacked film 22.

The bit lines BL1, BL2 and the source lines SL1, SL2 may be disposed in a layout different from the layout shown in FIG. 1. For example, the pitch between the bit lines BL1 may be constant as shown in FIG. 1 or may not be constant. Further, the density of the bit lines BL1 in the region R2 may be different from the density of the bit lines BL1 in the region R1. The same holds true for the bit lines BL2. Further, in FIG. 1, the columnar portions 28 are each electrically connected to only one of the bit line BL1 and the bit line BL2, but at least one columnar portion 28 may be electrically connected to both bit line BL1 and bit line BL2. In this case, the bit line BL1 and the bit line BL2 that are electrically connected to one columnar portion 28 may be electrically connected to the same transistor 12 in the S/A.

Figure 2:
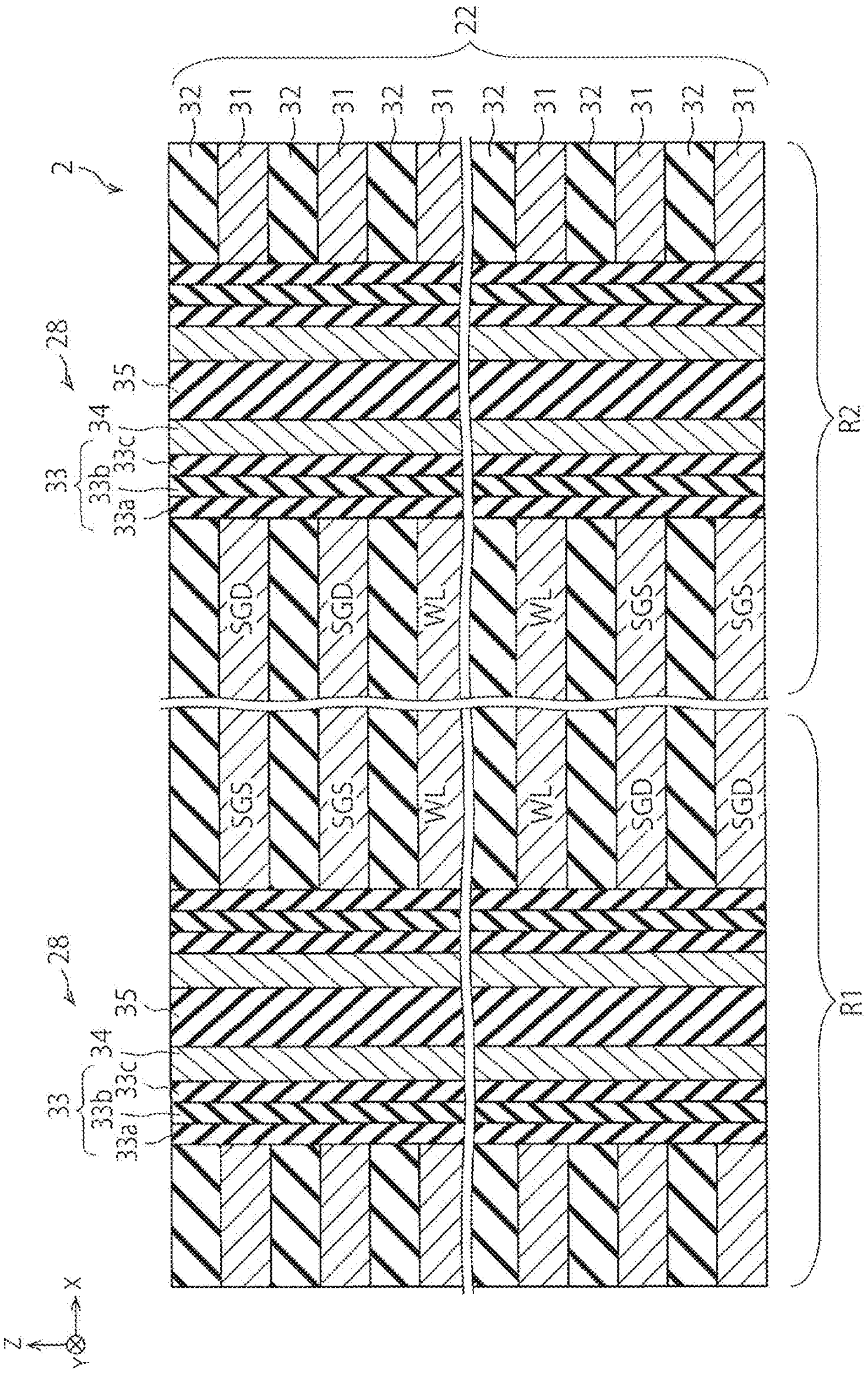
FIG. 2 is an enlarged cross-sectional view showing the structure of the semiconductor device of the first embodiment.

FIG. 2 is an enlarged cross-sectional view showing the structure of the semiconductor device of the first embodiment.

FIG. 2 shows one of the plurality of columnar portions 28 in the region R1 and one of the plurality of columnar portions 28 in the region R2. The columnar portions 28 shown in FIG. 2 each include the memory insulator 33, the channel semiconductor layer 34, the core insulator 35, and the core semiconductor layers 36, 37 (not shown), and the memory insulator 33 includes a block insulator 33*a*, a charge storage layer 33*b*, and a tunnel insulator 33*c* that are sequentially provided in the stacked film 22. The block insulator 33*a* is, for example, a $SiO_2$ film. The charge storage layer 33*b* is, for example, a SiN film (silicon nitride film). The tunnel insulator 33*c* is, for example, a $SiO_2$ film.

FIG. 2 further shows the plurality of electrode layers 31 and the plurality of insulators 32 included in the stacked film 22 similarly to FIG. 1. In the region R1, the uppermost two electrode layers 31 function as source-side select lines SGS, the lowermost two electrode layers 31 function as drain-side select lines SGD, and the others of the plurality of electrode layers 31 function as word lines WL. Meanwhile, in the region R2, the lowermost two electrode layers 31 function as the source-side select lines SGS, the uppermost two electrode layers 31 function as the drain-side select lines SGD, and the others of the plurality of electrode layers 31 function as the word lines WL.

Accordingly, the electrode layers 31 of the present embodiment each include a portion in the region R1 and a portion in the region R2 that is divided from the portion in the region R1. For example, the uppermost electrode layer 31 includes a portion that functions as the source-side select line SGS and a portion that functions as the drain-side select line SGD. The electrode layers 31 shown in FIG. 2 are examples of first, second, and third electrode layers. The word lines WL, the source-side select lines SGS, and the drain-side select lines SGD constitute, together with the columnar portions 28, a cell transistor (memory cell), a source-side select transistor, and a drain-side select transistor, respectively.

In the present embodiment, four electrode layers 31 include the source-side select lines SGS and the drain-side select lines SGD, but the number of the electrode layers 31 including the source-side select lines SGS and the drain-side select lines SGD may be other than four.

Figures 3A, 3B, 3C:
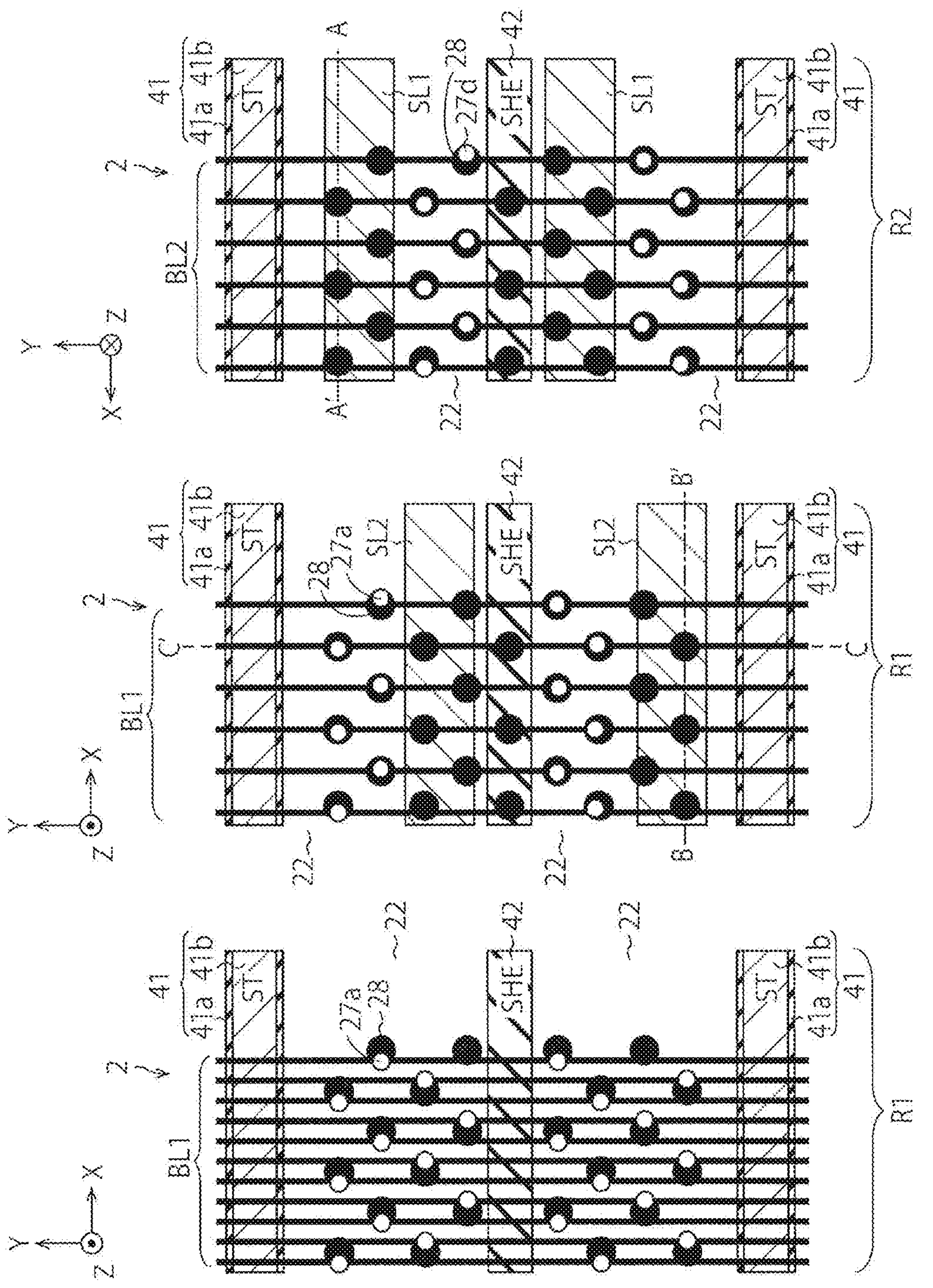
FIGS. 3A to 3C are plan views showing the structure of a semiconductor device of a comparative example of the first embodiment, and the structure of the semiconductor device of the first embodiment.

FIGS. 3A to 3C are plan views showing the structure of a semiconductor device of a comparative example of the first embodiment and the structure of the semiconductor device of the first embodiment.

FIG. 3A shows the semiconductor device of the comparative example of the present embodiment as viewed from above. FIG. 3B shows the semiconductor device of the present embodiment as viewed from above. FIG. 3C shows the semiconductor device of the present embodiment as viewed from below.

FIG. 3B shows the stacked film 22 in the region R1 of the present embodiment. FIG. 3B further shows two of a plurality of slits ST formed in the stacked film 22 and one of a plurality of trenches SHE formed in the stacked film 22. The slits ST each extend through the stacked film 22 in the Z direction and extend in the X direction. The trenches SHE each extend through part of the electrode layers 31 included in the stacked film 22 and extend between the slits ST in the X direction. For example, the trenches SHE in the region R1 each extend through the two source-side select lines SGS in the region R1 shown in FIG. 2.

FIG. 3B further shows a buried film 41 formed in each slit ST and a buried insulator 42 formed in each trench SHE. The buried film 41 includes an insulator 41*a* formed on a surface of each slit ST and an interconnect layer 41*b* formed in each slit ST via the insulator 41*a*. The insulator 41*a* is an example of a first insulator and the insulator 42 is an example of a second insulator. Each slit ST may include only the insulator 41*a* instead of including the insulator 41*a* and the interconnect layer 41*b*.

FIG. 3B further shows the plurality of bit lines BL1, the plurality of source lines SL2, the plurality of columnar portions 28, and the plurality of contact plugs 27*a* in the region R1. FIG. 3B shows the columnar portions 28 disposed on the bit lines BL1 via the contact plugs 27*a*, the columnar portions 28 disposed below the source lines SL2, and the columnar portions 28 disposed below the insulator 42. Below the insulator 42, upper faces of the columnar portions 28 contact a lower face of the insulator 42. The columnar portions 28 are examples of a third columnar portion. The source lines SL2 extend between the slit ST and the trench SHE in the X direction.

FIG. 3C shows the stacked film 22 in the region R2 of the present embodiment. FIG. 3C further shows two of the plurality of slits ST formed in the stacked film 22 and one of the plurality of trenches SHE formed in the stacked film 22. The slits ST shown in FIG. 3C are the same as the slits ST shown in FIG. 3B. Meanwhile, the trench SHE shown in FIG. 3C is different from the trench SHE shown in FIG. 3B. The shape of the slit ST and the trench SHE and the buried film shown in FIG. 3C are the same as the shape of the slit ST and the trench SHE and the buried film shown in FIG. 3B. For example, the trenches SHE in the region R2 each extend through the two source-side select lines SGS in the region R2 shown in FIG. 2.

FIG. 3C further shows the plurality of bit lines BL2, the plurality of source lines SL1, the plurality of columnar portions 28, and the plurality of contact plugs 27*a* in the region R2. FIG. 3C shows the columnar portions 28 disposed below the bit lines BL2 via the contact plugs 27*d*, the columnar portions 28 disposed on the source lines SL1, and the columnar portions 28 disposed on the insulator 42. On the insulator 42, lower faces of the columnar portions 28 contact an upper face of the insulator 42. The columnar portions 28 are also examples of the third columnar portion. The source lines SL1 extend between the slit ST and the trench SHE in the X direction.

FIG. 3A shows the stacked film 22 in the region R1 of the comparative example of the present embodiment. The semiconductor device of the present comparative example includes the stacked film 22 and the columnar portions 28, as with the semiconductor device of the present embodiment. However, the semiconductor device of the present comparative example includes the bit lines BL1 and the source lines SL2, but does not include the bit lines BL2 or the source lines SL1. Therefore, the pitch between the bit lines BL1 of the present comparative example is reduced (FIG. 3A). Meanwhile, the present embodiment makes it possible to increase the pitch between the bit lines BL1 and the pitch between the bit lines BL2, with the bit lines BL2 provided as well as the bit lines BL1 (FIGS. 3B and 3C).

Figure 4C:
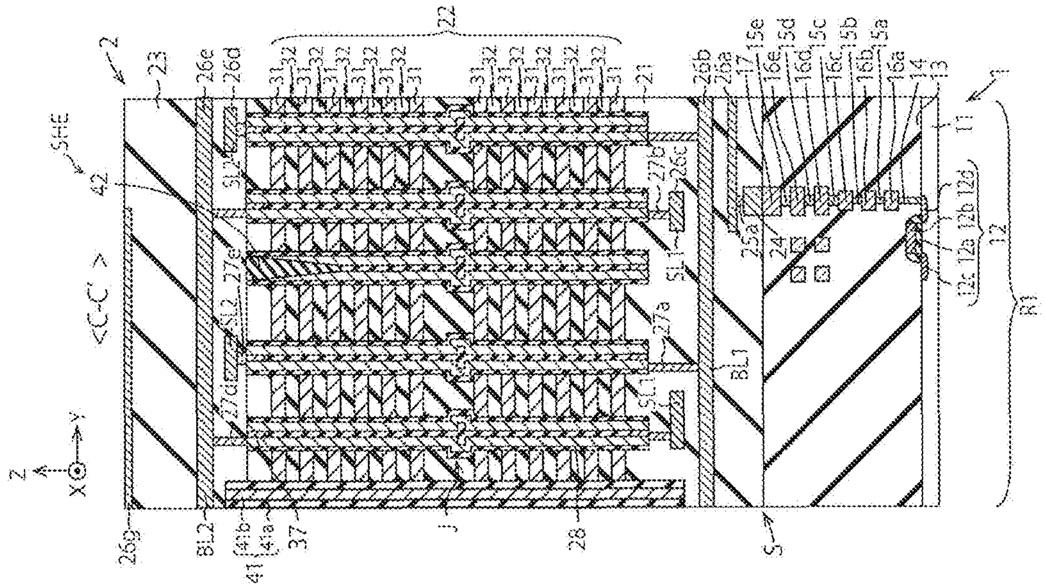
FIGS. 4A to 4C are cross-sectional views showing the structure of the semiconductor device of the first embodiment.
Figure 4B:
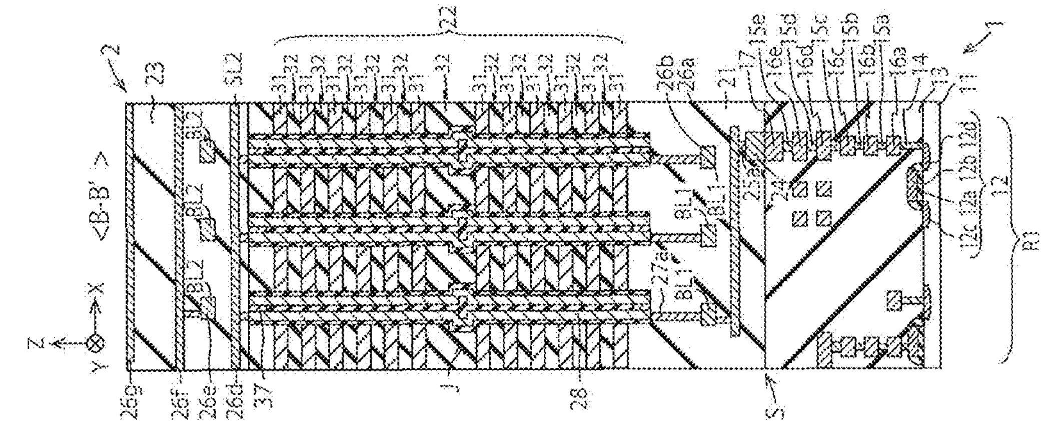
Figure 4A:
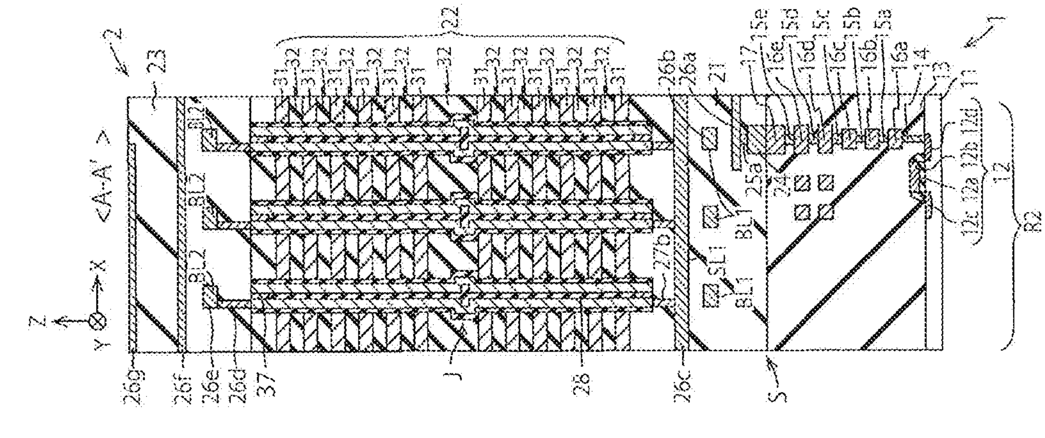

FIGS. 4A to 4C are cross-sectional views showing the structure of the semiconductor device of the first embodiment.

FIG. 4A is an XZ-cross-sectional view taken along line A-A' shown in FIG. 3C. Therefore, FIG. 4A shows the source lines SL1 and the like shown in FIG. 3C.

FIG. 4B is an XZ-cross-sectional view taken along line B-B' shown in FIG. 3B. Therefore, FIG. 4B shows the source lines SL2 and the like shown in FIG. 3B.

FIG. 4C is a YZ-cross-sectional view taken along line C-C' shown in FIG. 3B. Therefore, FIG. 4C shows the insulator 42 (trench SHE) and the like shown in FIG. 3B.

Figure 5:
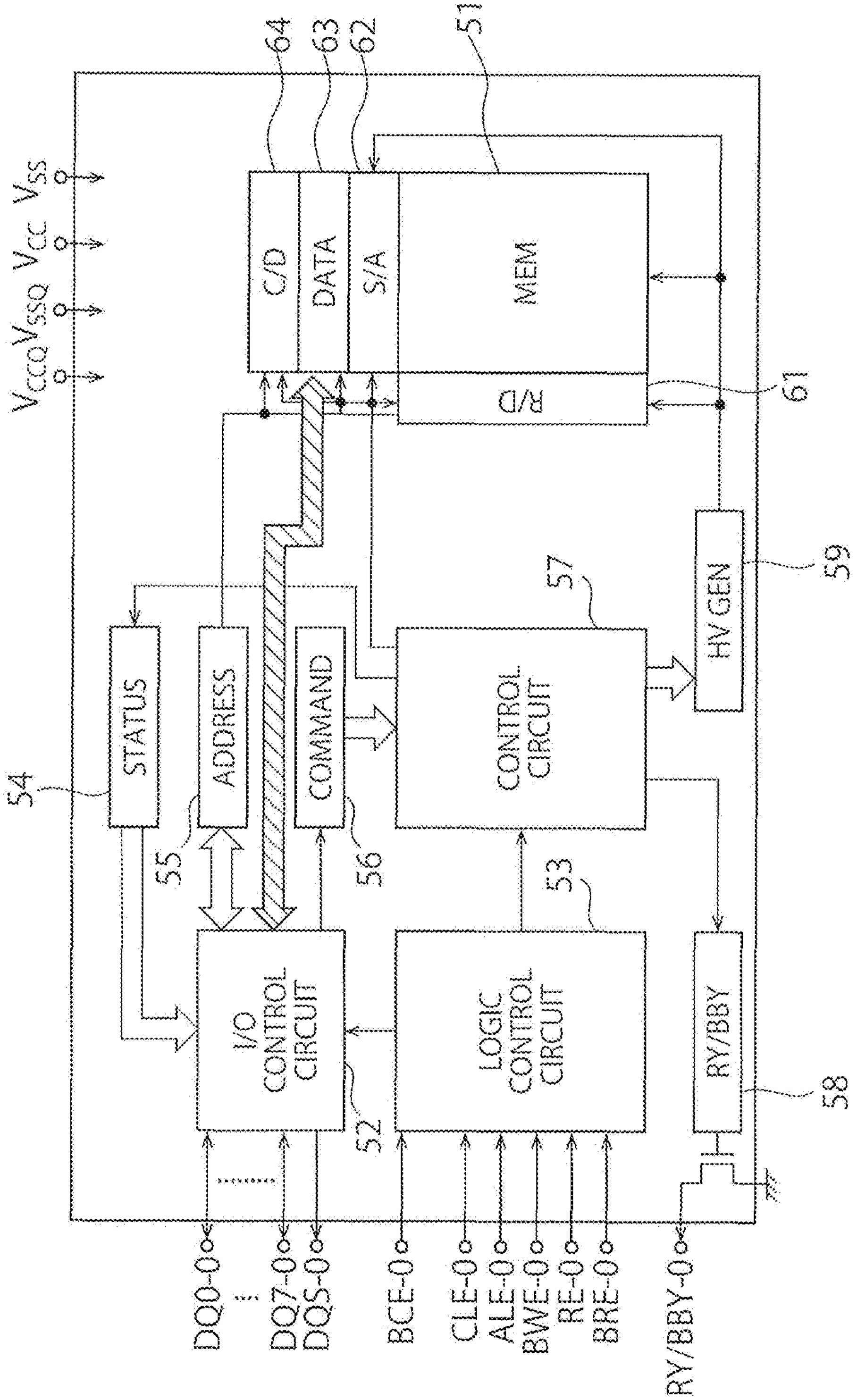
FIG. 5 is a block diagram showing the structure of the semiconductor device of the first embodiment.

FIG. 5 is a block diagram showing the configuration of the semiconductor device of the first embodiment.

In FIG. 5, the semiconductor device of the present embodiment includes a memory cell array 51, an I/O (Input/Output) control circuit 52, a logic control circuit 53, a status resistor 54, an address resistor 55, a command resistor 56, a control circuit 57, a ready/busy circuit 58, a voltage generator 59, a row decoder 61, a sense amplifier 62, a data resistor 63, and a column decoder 64.

The memory cell array 51 is composed of the aforementioned stacked film 22, columnar portions 28, and the like, and includes a plurality of memory cells. The I/O control circuit 52 provides/receives input signals and output signals to/from a controller (not shown) via data lines DQ0-0 to DQ7-0. The logic control circuit 53 receives a chip enable signal BCE-0, a command latch enable signal CLE-0, an address latch enable signal ALE-0, a write enable signal BWE-0, and read enable signals RE-0 and BRE-0, and controls the operation of the I/O control circuit 52 and the control circuit 57 in accordance with these signals.

The status resistor 54 stores the status such as a read operation, a write operation, and an erase operation and is used to notify the completion of these operations to the controller. The address resistor 55 is used to store the address signal that the I/O control circuit 52 has received from the controller. The command resistor 56 is used to store the command signal that the I/O control circuit 52 has received from the controller.

The control circuit 57 controls the status resistor 54, the ready/busy circuit 58, the voltage generator 59, the row decoder 61, the sense amplifier 62, the data resistor 63, and the column decoder 64 in accordance with the command signals from the command resistor 56 and performs the operations such as the read operation, the write operation, and the erase operation.

The ready/busy circuit 58 transmits a ready/busy signal RY/BBY-0 to the controller in accordance with the operation conditions of the control circuit 57. This makes it possible to notify whether the control circuit 57 is available or unavailable for reception of the command. The voltage generator 59 generates the voltage required for the read operation, the write operation, and the erase operation.

The row decoder 61 applies voltage to the word lines WL. The sense amplifier 62 detects data read in the bit lines BL1 and the bit lines BL2. The data resistor 63 is used to store the data from the I/O control circuit 52 and the sense amplifier 62. The column decoder 64 decodes a column address and selects a latch circuit in the data resistor 63 based on the decoded results. The row decoder 61, the sense amplifier 62, the data resistor 63, and the column decoder 64 function as an interface for the read operation, the write operation, and the erase operation to the memory cell array 51.

These blocks excluding the memory cell array 51 are included in the aforementioned CMOS circuit and formed by the transistor 12.

FIGS. 6 to 9 are cross-sectional views showing a method of manufacturing the semiconductor device of the first embodiment.

Figure 6:
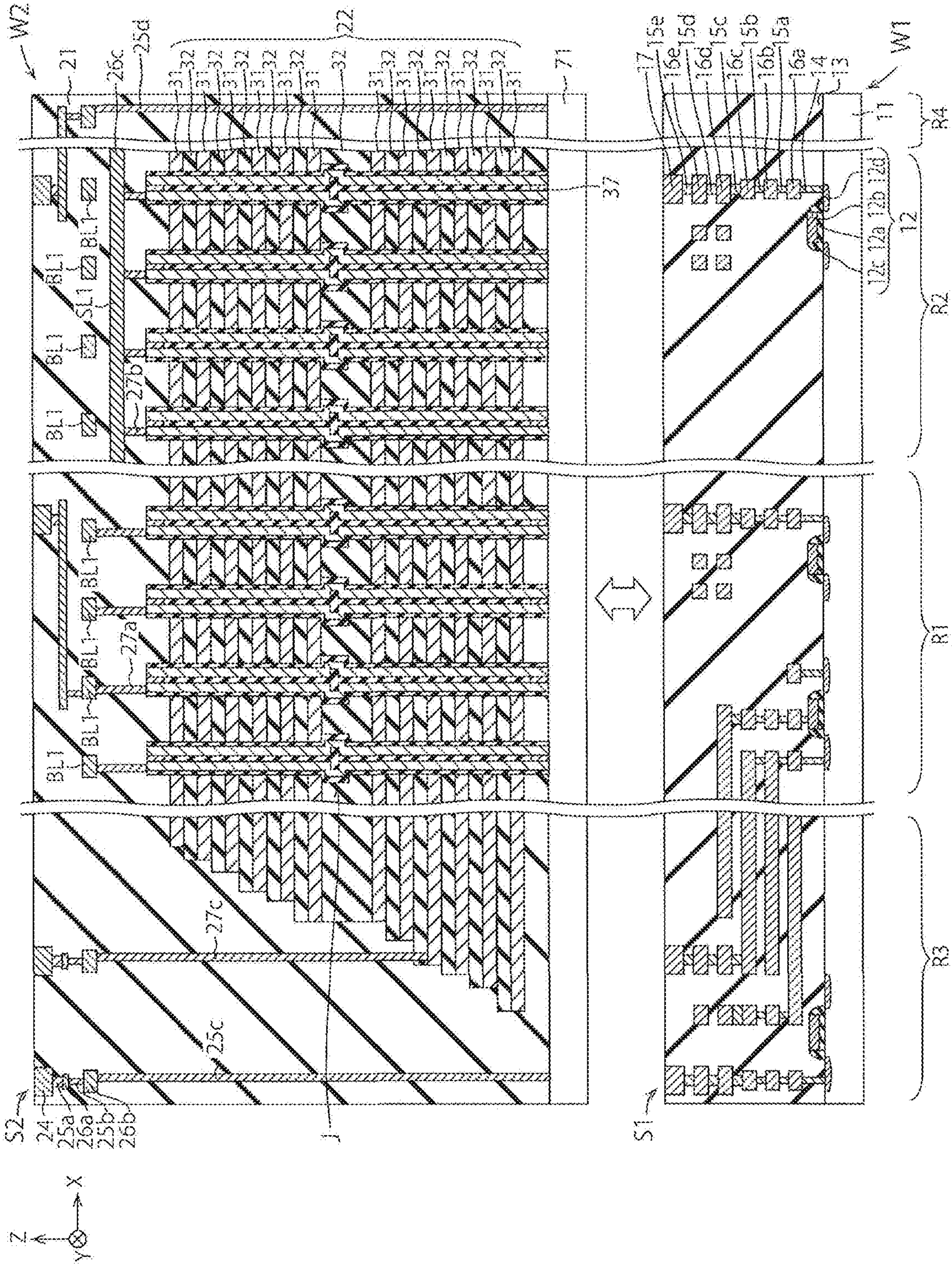
FIGS. 6 to 9 are cross-sectional views showing a method of manufacturing the semiconductor device of the first embodiment.

FIG. 6 shows a circuit wafer W1 including the circuit chip 1 and an array wafer W2 including the array chip 2. FIG. 6 further shows an upper face S1 of the circuit wafer W1 and an upper face S2 of the array wafer W2. The orientation of the array wafer W2 shown in FIG. 6 is opposite to the orientation of the array chip 2 shown in FIG. 1. As described above, the semiconductor device of the present embodiment is manufactured by bonding the circuit wafer W1 and the array wafer W2 together. FIG. 6 shows the array wafer W2 before the orientation is inverted for bonding, and FIG. 7 shows the array wafer W2 with the orientation inverted for bonding and after being bonded to the circuit wafer W1.

The semiconductor device of the present embodiment is manufactured as follows, for example. First, the plurality of transistors 12, the inter layer dielectric 13, the plurality of contact plugs 14, the plurality of via plugs **15*a* to 15*e*, the plurality of interconnect layers 16*a* to 16*e*, and the plurality of metal pads 17 are formed on the substrate 11 (FIG. 6). The substrate 11 is an example of a second substrate. Further, the inter layer dielectric 21, the stacked film 22, the plurality of metal pads 24, the plurality of via plugs 25*a* to 25*d*, the plurality of interconnect layers 26*a* to 26*c*, the plurality of contact plugs 27*a* to 27*c*, and the plurality of columnar portions 28 are formed on a substrate 71 (FIG. 6). The substrate 71 is, for example, a semiconductor substrate such as a Si substrate. The substrate 71** is an example of a first substrate.

The stacked film 22 is formed so as to include the aforementioned plurality of electrode layers 31 and plurality of insulators 32. The columnar portions 28 are each formed so as to include the aforementioned memory insulator 33, channel semiconductor layer 34, core insulator 35, core semiconductor layer 36, and core semiconductor layer 37. The interconnect layer **26*c* is formed above the stacked film 22 so as to include the plurality of source lines SL1. The interconnect layer 26*b* is formed above the stacked film 22 so as to include the plurality of bit lines BL1 after the interconnect layer 26*c* is formed. Therefore, the interconnect layer 26*b* shown in FIG. 6 is formed at a higher position than the interconnect layer 26*c*. Alternatively, the interconnect layer 26*b* may be formed before the interconnect layer 26*c* is formed. In this case, the interconnect layer 26*b* is formed at a lower position than the interconnect layer 26*c* in FIG. 6**.

Figure 7:
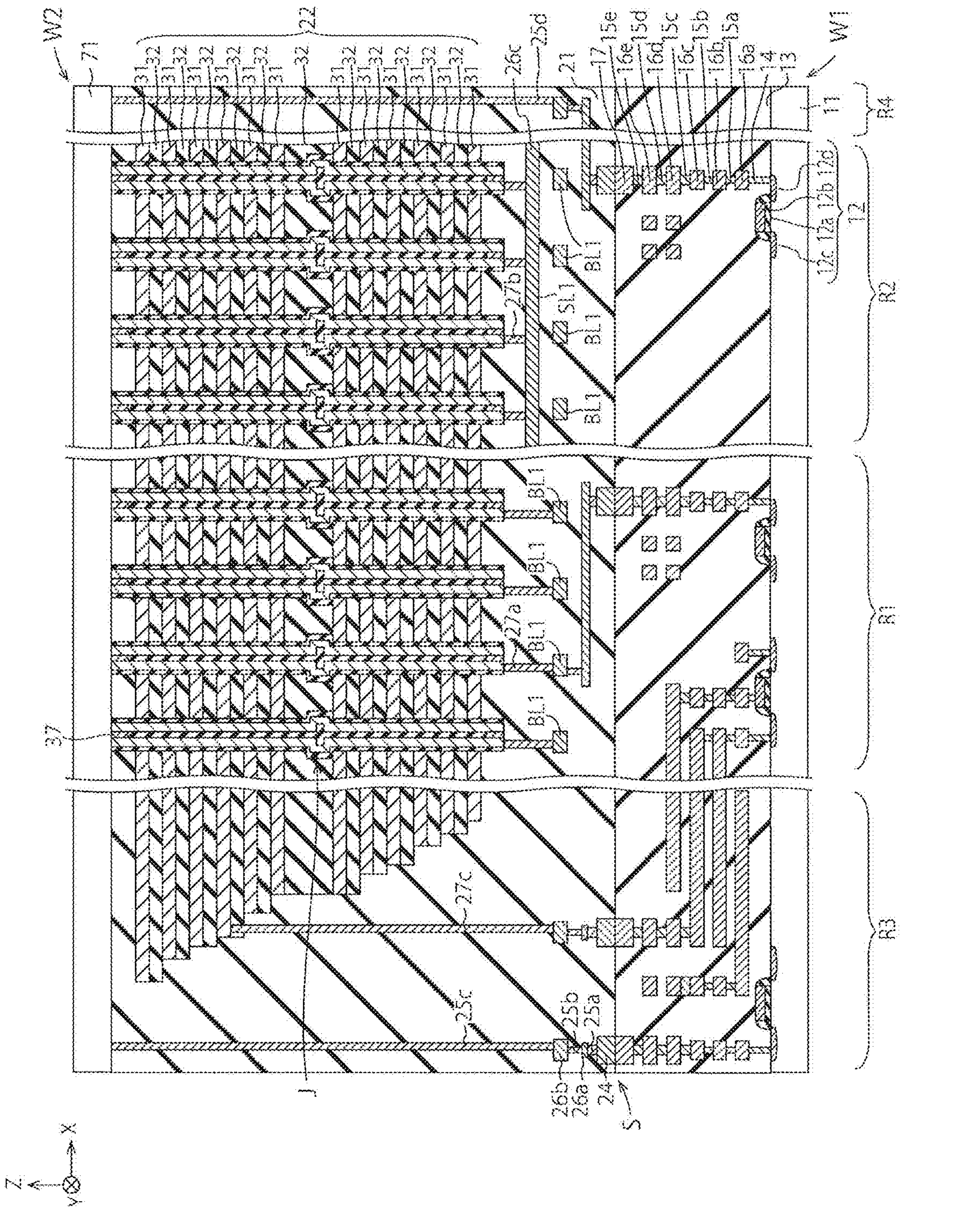

Next, as shown in FIG. 7, the circuit wafer W1 and the array wafer W2 are bonded together using mechanical pressure. In this manner, the inter layer dielectric 13 and the inter layer dielectric 21 are adhesively bonded. Subsequently, the circuit wafer W1 and the array wafer W2 are annealed. In this manner, the metal pads 17 and the metal pads 24 are bonded together.

Figure 8:
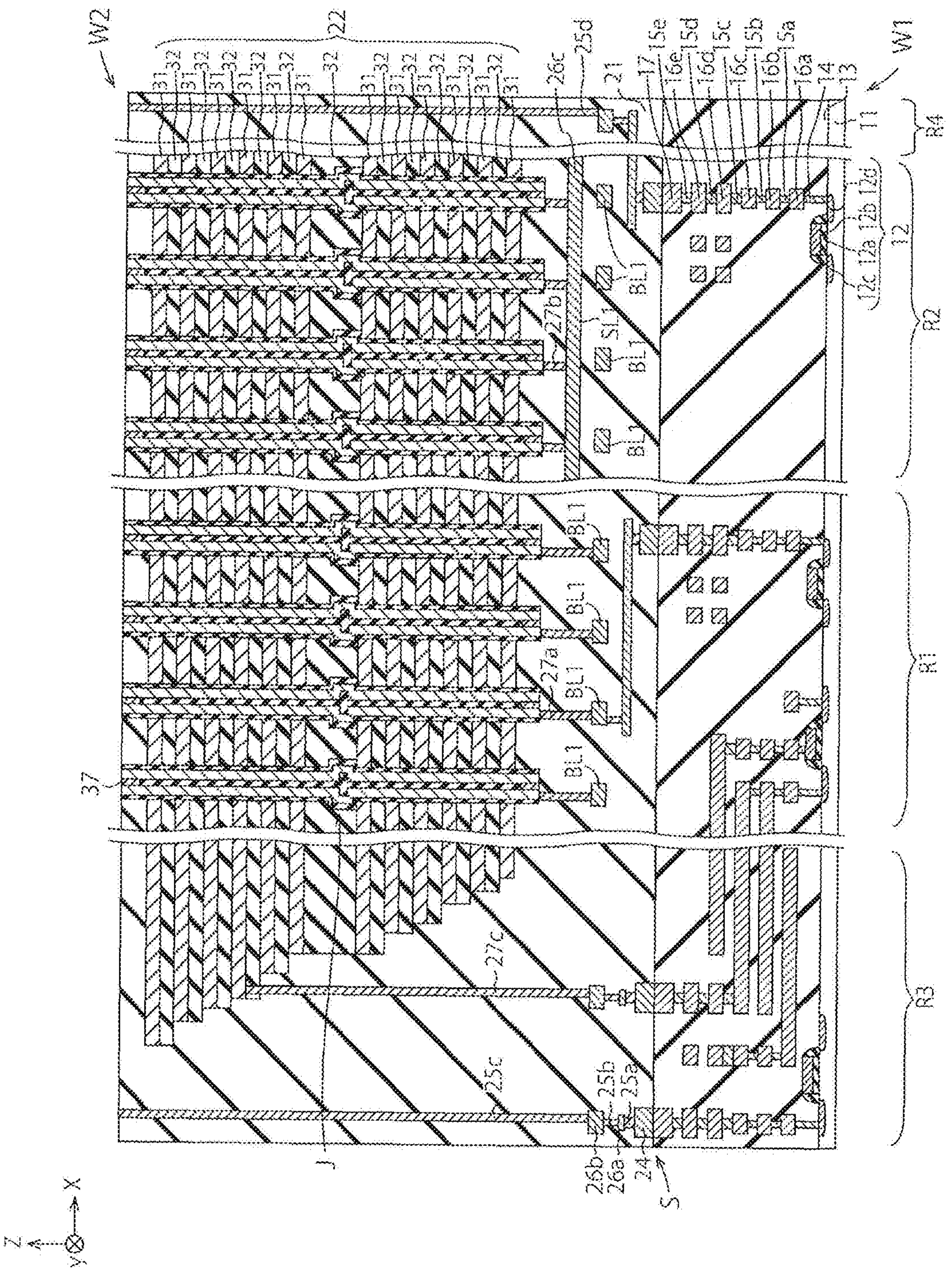

Next, the substrate 11 is thinned by CMP (Chemical Mechanical Polishing) or etching (FIG. 8). Further, the substrate 71 is removed by CMP or etching to expose the inter layer dielectric 21, the via plugs **25*c* to 25*d*, and the columnar portions 28 (FIG. 8**).

Figure 9:
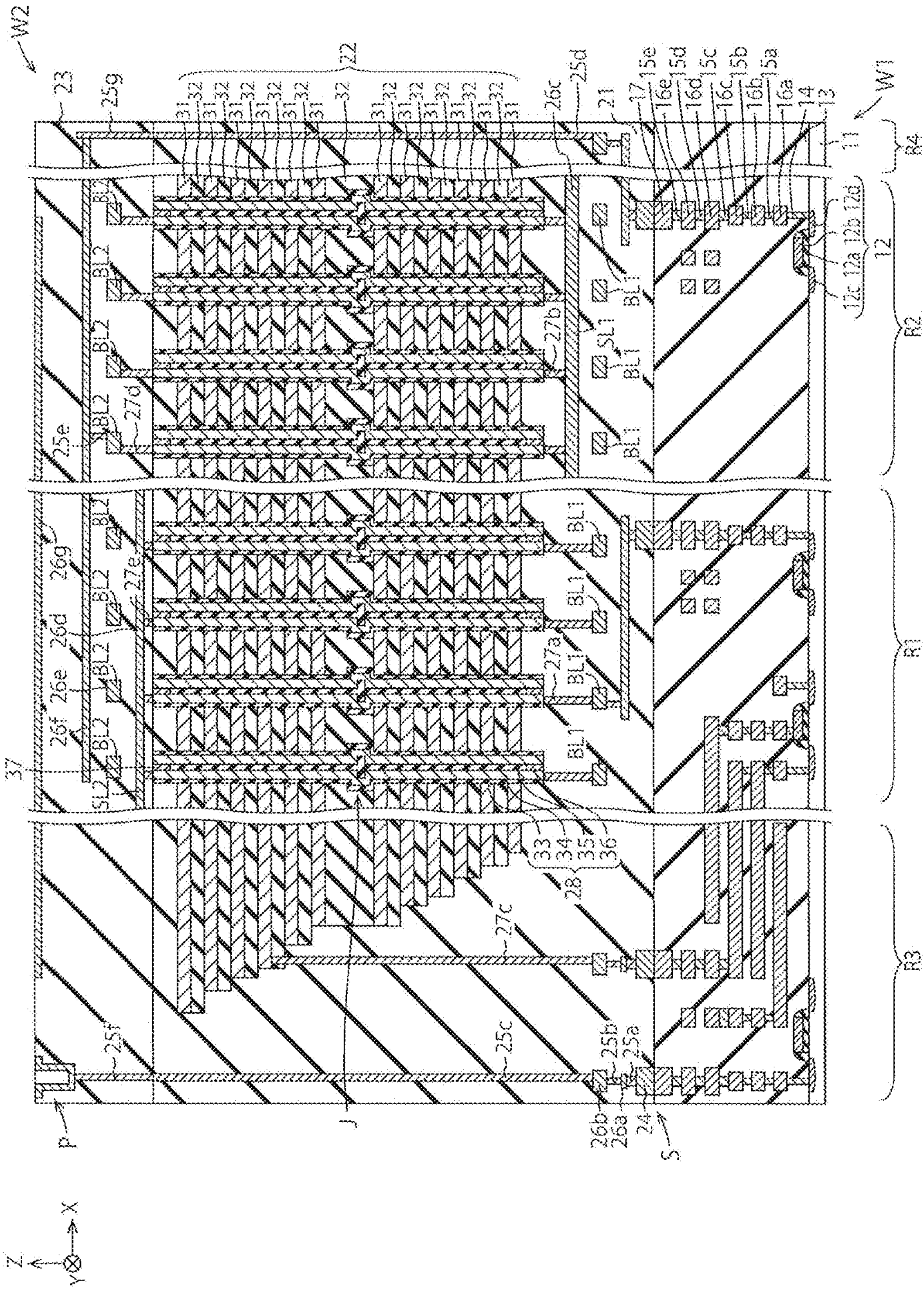

Next, on the inter layer dielectric 21, the inter layer dielectric 23, the plurality of via plugs **25*e* to 25*g*, the plurality of interconnect layers 26*d* to 26*g*, and the plurality of contact plugs 27*d* to 27*e* are formed (FIG. 9**).

The interconnect layer **26*d* is formed above the stacked film 22 so as to include the plurality of source lines SL2. The interconnect layer 26*e* is formed above the stacked film 22 so as to include the plurality of bit lines BL2 after the interconnect layer 26*d* is formed. Therefore, the interconnect layer 26*e* shown in FIG. 9 is formed at a higher position than the interconnect layer 26*d*. Alternatively, the interconnect layer 26*e* may be formed before the interconnect layer 26*d* is formed. In this case, the interconnect layer 26*e* is formed at a lower position than the interconnect layer 26*d* in FIG. 9**.

Thereafter, the circuit wafer W1 and the array wafer W2 are cut (diced) into a plurality of semiconductor chips. In this manner, the semiconductor device shown in FIG. 1 is manufactured.

The slits ST and the buried films 41 shown in FIGS. 3B and 3C are formed in the step of FIG. 6. For example, the stacked film 22 is formed so as to alternately include a plurality of sacrificial layers and the plurality of insulators 32, and thereafter, the slits ST are formed in the stacked film 22, and the plurality of sacrificial layers are replaced with the plurality of electrode layers 31 using the slits ST, and then, the buried films 41 are formed in the slits ST. The sacrificial layers are, for example, a SiN film. Further, the trench SHE and the buried insulator 42 shown in FIG. 3B are formed, for example, in the step of FIG. 9. Furthermore, the trench SHE and the buried insulator 42 shown in FIG. 3C are formed, for example, in the step of FIG. 6.

Furthermore, FIG. 1 shows a boundary face between the inter layer dielectric 13 and the inter layer dielectric 21 and a boundary face between the metal pads 17 and the metal pads 24, but in general, these boundary faces are no longer observed after the aforementioned annealing. However, the positions where these boundary faces were present can be assumed by detecting the inclination of the side faces of the metal pads 17, the inclination of the side faces of the metal pads 24, and the positional deviation between the metal pads 17 and the metal pads 24.

As described above, the semiconductor device of the present embodiment includes not only the bit lines BL1 disposed below the stacked film 22, but also the bit lines BL2 disposed above the stacked film 22. Further, the semiconductor device of the present embodiment includes not only the source lines SL1 disposed above the stacked film 22, but also the source lines SL2 disposed below the stacked film 22. Therefore, as compared to the case in which the bit lines are disposed only below the stacked film 22 and the case in which the bit lines are disposed only above the stacked film 22, the present embodiment makes it possible to increase the pitch between the bit lines BL1 and the pitch between the bit lines BL2. This makes it possible to reduce the parasitic capacitance of the bit lines BL1, BL2, so that the write performance and the read performance of the memory cells can be improved.

Second to Fourth Embodiments

Figure 10C:
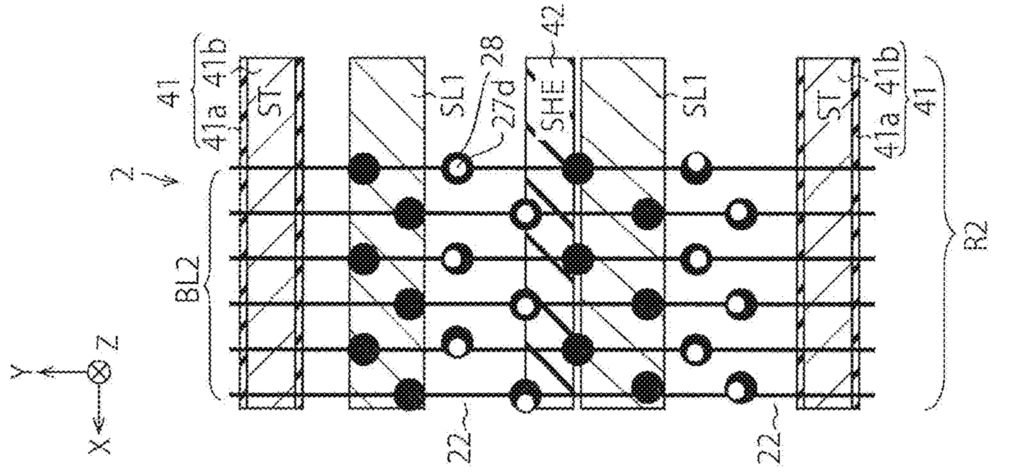
FIGS. 10A to 10C are plan views showing the structure of a semiconductor device of a comparative example of a second embodiment, and the structure of a semiconductor device of the second embodiment.
Figure 10B:
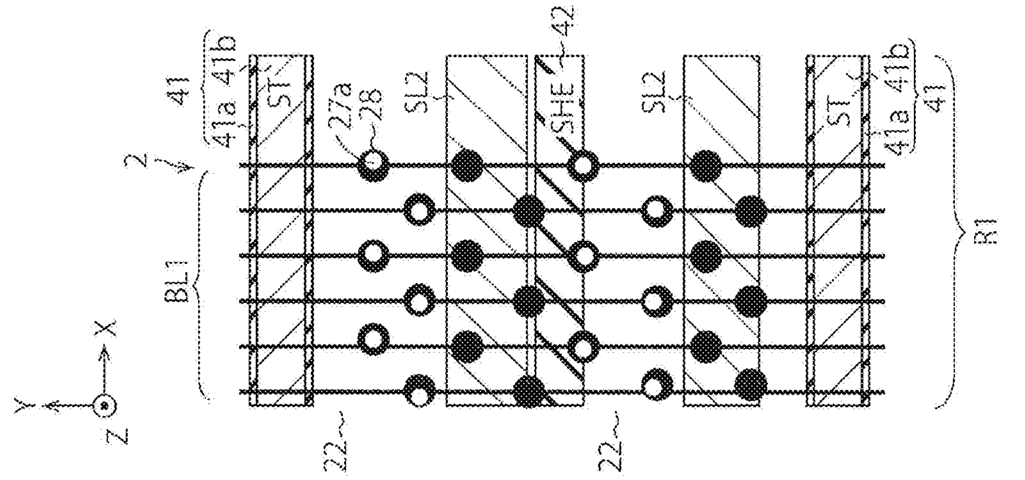
Figure 10A:
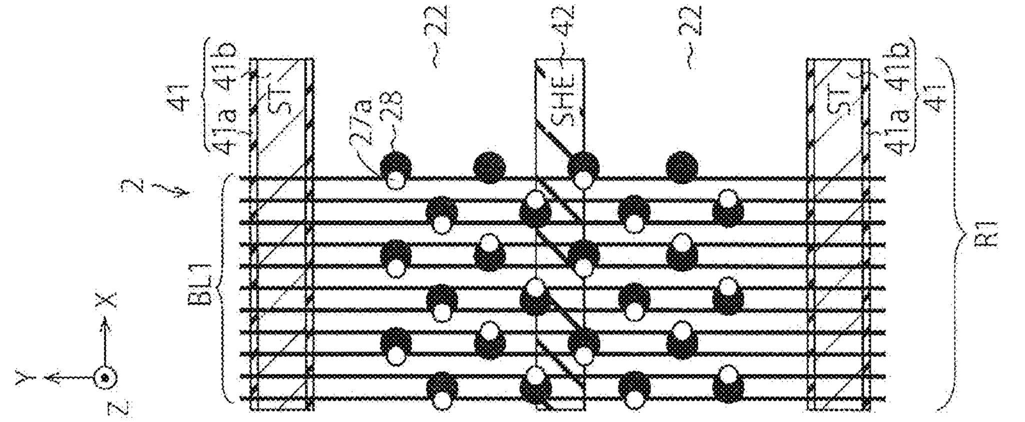

FIGS. 10A to 10C are plan views showing the structure of a semiconductor device of a comparative example of a second embodiment and the structure of a semiconductor device of the second embodiment.

FIG. 10A shows the semiconductor device of the comparative example of the present embodiment as viewed from above. FIG. 10B shows the semiconductor device of the present embodiment as viewed from above. FIG. 10C shows the semiconductor device of the present embodiment as viewed from below. FIG. 10A to FIG. 10C correspond to FIGS. 3A to 3C, respectively.

In FIGS. 3B and 3C, the plurality of columnar portions 28 are disposed such that five columnar portions 28 are adjacent to one another between the slits ST in the Y direction (five-column lined-up structure). Further, some of the plurality of columnar portions 28 shown in FIG. 3B are disposed below the insulator 42, and some of the plurality of columnar portions 28 shown in FIG. 3C are disposed on the insulator 42. Below the insulator 42 shown in FIG. 3B, the entire upper face of each columnar portion 28 contacts the lower face of the insulator 42. On the insulator 42 shown in FIG. 3C, the entire lower face of each columnar portion 28 contacts the upper face of the insulator 42.

In FIGS. 10B and 10C, the plurality of columnar portions 28 are disposed such that four columnar portions 28 are adjacent to one another between the slits ST in the Y direction (four-column lined-up structure). Further, some of the plurality of columnar portions 28 shown in FIG. 10B are disposed below the insulator 42, and some of the plurality of columnar portions 28 shown in FIG. 10C are disposed on the insulator 42. Below the insulator 42 shown in FIG. 10B, only a part of the upper faces of the columnar portions 28 contacts the lower face of the insulator 42. A part of the side faces of the columnar portions 28 contacts the insulator 42. On the insulator 42 shown in FIG. 10C, only a part of the lower faces of the columnar portions 28 contacts the upper face of the insulator 42. A part of the side faces of the columnar portions 28 contacts the insulator 42.

Figure 11C:
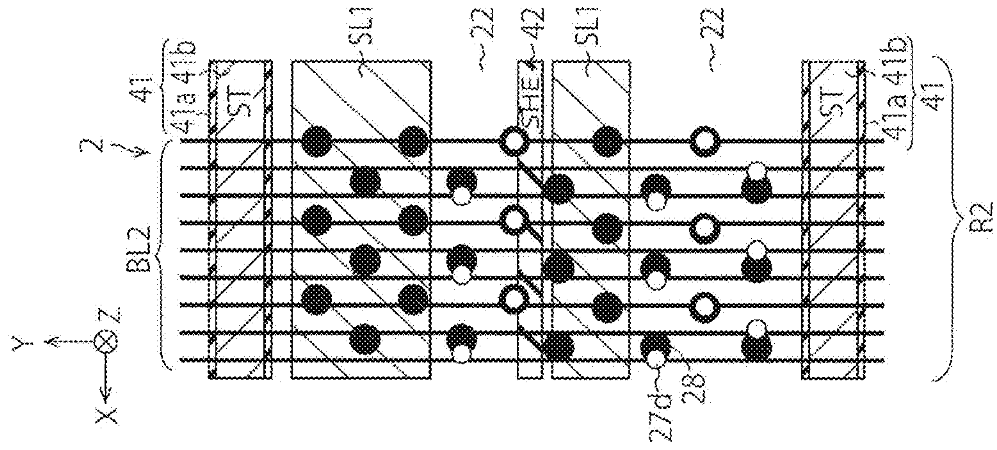
FIGS. 11A to 11C are plan views showing the structure of a semiconductor device of a comparative example of a third embodiment, and the structure of a semiconductor device of the third embodiment.
Figure 11B:
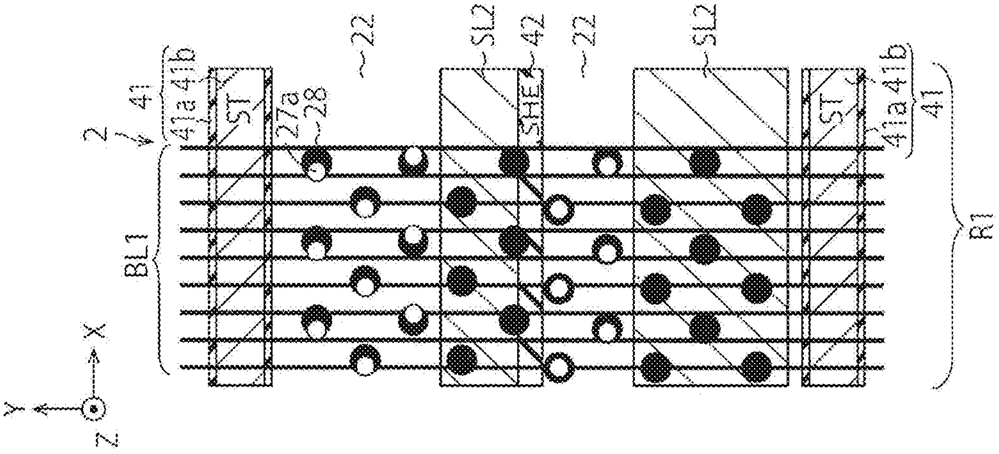
Figure 11A:
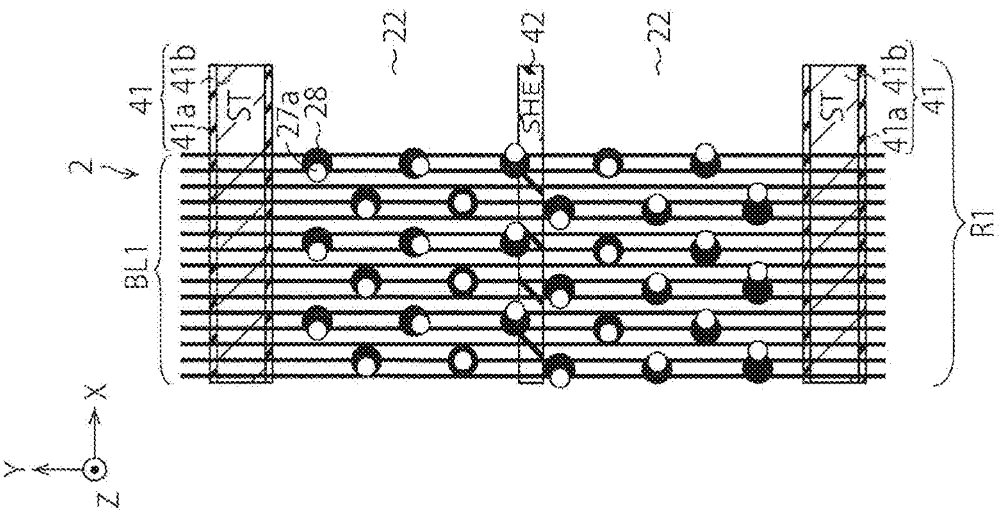

FIGS. 11A to 11C are plan views showing the structure of a semiconductor device of a comparative example of a third embodiment and the structure of a semiconductor device of the third embodiment.

FIG. 11A shows the semiconductor device of the comparative example of the present embodiment as viewed from above. FIG. 11B shows the semiconductor device of the present embodiment as viewed from above. FIG. 11C shows the semiconductor device of the present embodiment as viewed from below. FIGS. 11A to 11C correspond to FIGS. 3A to 3C, respectively.

In FIGS. 11B and 11C, the plurality of columnar portions 28 are disposed such that five columnar portions 28 are adjacent to one another between the slits ST in the Y direction (five-column lined-up structure). Further, some of the plurality of columnar portions 28 shown in FIG. 11B are disposed below the insulator 42, and some of the plurality of columnar portions 28 shown in FIG. 11C are disposed on the insulator 42. Below the insulator 42 shown in FIG. 11B, only a part of the upper faces of the columnar portions 28 contacts the lower face of the insulator 42. A part of the side faces of the columnar portions 28 contacts the insulator 42. On the insulator 42 shown in FIG. 11C, only a part of the lower faces of the columnar portions 28 contacts the upper face of the insulator 42. A part of the side faces of the columnar portions 28 contacts the insulator 42.

Figures 12A, 12B, 12C:
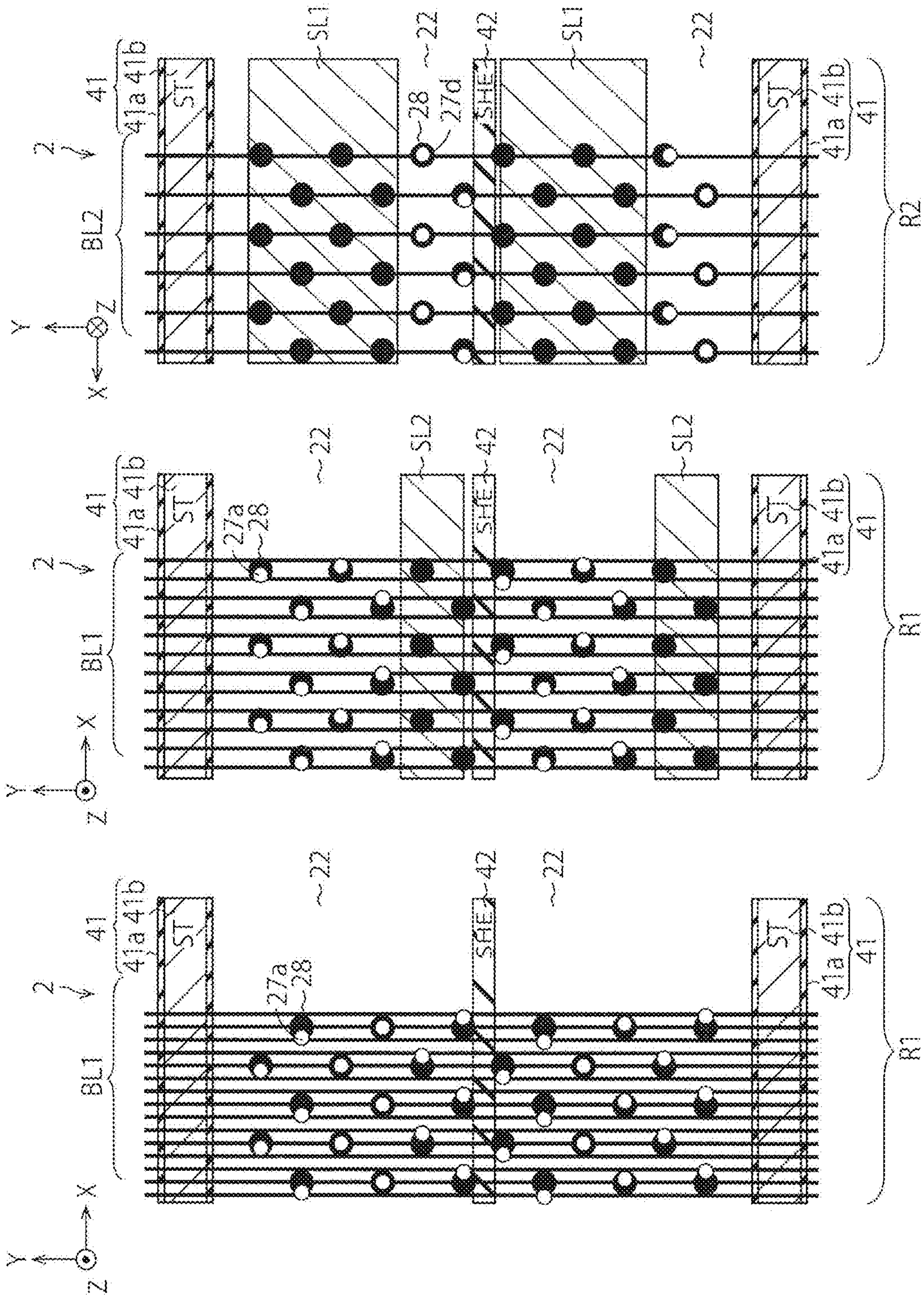
FIGS. 12A to 12C are plan views showing the structure of a semiconductor device of a comparative example of a fourth embodiment, and the structure of a semiconductor device of the fourth embodiment.

FIGS. 12A to 12C are plan views showing the structure of a semiconductor device of a comparative example of a fourth embodiment and the structure of a semiconductor device of the fourth embodiment.

FIG. 12A shows the semiconductor device of the comparative example of the present embodiment as viewed from above. FIG. 12B shows the semiconductor device of the present embodiment as viewed from above. FIG. 12C shows the semiconductor device of the present embodiment as viewed from below. FIGS. 12A to 12C correspond to FIGS. 3A to 3C, respectively.

In FIGS. 12B and 12C, the plurality of columnar portions 28 are disposed such that six columnar portions 28 are adjacent to one another between the slits ST in the Y direction (six-column lined-up structure). Some of the plurality of columnar portions 28 shown in FIG. 12B are disposed below the insulator 42, and some of the plurality of columnar portions 28 shown in FIG. 12C are disposed on the insulator 42. Below the insulator 42 shown in FIG. 12B, only a part of the upper faces of the columnar portions 28 contacts the lower face of the insulator 42. A part of the side faces of the columnar portions 28 contacts the insulator 42. On the insulator 42 shown in FIG. 12C, only a part of the lower faces of the columnar portions 28 contacts the upper face of the insulator 42. A part of the side faces of the columnar portions 28 contacts the insulator 42.

In this manner, the arrangement of the columnar portions 28 may be in any of the four-column lined-up structure, the five-column lined-up structure, and the six-column lined-up structure and further, in an N-column structure (N is a positive integer other than 4, 5, and 6). Similarly to the first embodiment, as compared to the case in which the bit lines are disposed only below the stacked film 22 and the case in which the bit lines are disposed only above the stacked film 22, the second to fourth embodiments make it possible to increase the pitch between the bit lines BL1 and the pitch between the bit lines BL2. As shown in FIGS. 12B and 12C, the pitch between the bit lines BL1 and the pitch between the bit lines BL2 may be different from each other.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:

a memory cell array;

a first interconnect layer provided below the memory cell array, and including a plurality of first bit lines that extend in a first direction;

a second interconnect layer provided below the memory cell array, and including a plurality of first source lines that extend in a second direction different from the first direction, the second interconnect layer being different from the first interconnect layer;

a third interconnect layer provided above the memory cell array, and including a plurality of second source lines that extend in the second direction; and a fourth interconnect layer provided above the memory cell array, and including a plurality of second bit lines that extend in the first direction, the fourth interconnect layer being different from the third interconnect layer.

2. The device of claim 1, wherein the second interconnect layer is provided at a higher position than the first interconnect layer, and the fourth interconnect layer is provided at a higher position than the third interconnect layer.

3. The device of claim 1, wherein the second direction is perpendicular to the first direction.

4. The device of claim 1, wherein the memory cell array comprises a stacked film including a plurality of electrode layers and a plurality of insulators that are alternately stacked in a third direction that is different from the first direction and the second direction.

5. The device of claim 4, wherein the plurality of electrode layers comprise:

a first electrode layer including a word line;

a second electrode layer provided below the first electrode layer, and including a source-side select line and a drain-side select line; and a third electrode layer provided above the first electrode layer, and including a source-side select line and a drain-side select line.

6. The device of claim 4, wherein the memory cell array further comprises a plurality of columnar portions, each of which is provided in the stacked film, includes a charge storage layer and a semiconductor layer, and extends in the third direction.

7. The device of claim 6, wherein the plurality of columnar portions comprise:

a first columnar portion electrically connected to one of the first bit lines and one of the second source lines; and a second columnar portion electrically connected to one of the second bit lines and one of the first source lines.

8. The device of claim 6, wherein the memory cell array comprises:

a plurality of first insulators provided in the stacked film, and extending in the second direction; and a second insulator provided in the stacked film, extending in the second direction between the first insulators, and contacting a third columnar portion of the plurality of columnar portions.

9. The device of claim 1, further comprising:

a first transistor provided below the memory cell array, and electrically connected to one of the first bit lines; and a second transistor provided below the memory cell array, and electrically connected to one of the second bit lines.

10. The device of claim 9, wherein the first transistor and the second transistor are provided on a same substrate.

11. The device of claim 10, wherein the first transistor is electrically connected to one of the first bit lines via a first pad that is provided above the substrate, and a second pad that is provided on the first pad, and the second transistor is electrically connected to one of the second bit lines via a third pad that is provided above the substrate, and a fourth pad that is provided on the third pad.

12. A method of manufacturing a semiconductor device, comprising:

forming a memory cell array on a first substrate;

forming, above the memory cell array, a first interconnect layer including a plurality of first bit lines that extend in a first direction, and a second interconnect layer including a plurality of first source lines that extend in a second direction different from the first direction, the second interconnect layer being different from the first interconnect layer;

bonding the first substrate to a second substrate via the memory cell array, the first interconnect layer, and the second interconnect layer to dispose the first substrate on the second substrate;

removing the first substrate after bonding the first substrate to the second substrate; and forming, above the memory cell array, a third interconnect layer including a plurality of second source lines that extend in the second direction, and a fourth interconnect layer including a plurality of second bit lines that extend in the first direction after removing the first substrate, the fourth interconnect layer being different from the third interconnect layer.

13. The method of claim 12, wherein the second interconnect layer is formed before forming the first interconnect layer, and the fourth interconnect layer is formed after forming the third interconnect layer.

14. The method of claim 12, wherein the second direction is perpendicular to the first direction.

15. The method of claim 12, wherein the memory cell array is formed to comprise a stacked film including a plurality of electrode layers and a plurality of insulators that are alternately stacked in a third direction that is different from the first direction and the second direction.

16. The method of claim 15, wherein the plurality of electrode layers comprise:

a first electrode layer including a word line;

a second electrode layer provided above the first electrode layer, and including a source-side select line and a drain-side select line; and a third electrode layer provided below the first electrode layer, and including a source-side select line and a drain-side select line.

17. The method of claim 15, wherein the memory cell array further comprises a plurality of columnar portions, each of which is provided in the stacked film, includes a charge storage layer and a semiconductor layer, and extends in the third direction.

18. The method of claim 17, wherein the plurality of columnar portions comprise:

a first columnar portion electrically connected to one of the first bit lines and one of the second source lines; and a second columnar portion electrically connected to one of the second bit lines and one of the first source lines.

19. The method of claim 12, further comprising forming a first transistor and a second transistor on the second substrate before bonding the first substrate to the second substrate, wherein the first transistor is electrically connected to one of the first bit lines, and the second transistor is electrically connected to one of the second bit lines.

20. The method of claim 19, wherein the first substrate is bonded to the second substrate via the first transistor and the second transistor.

* * * * *